(12) United States Patent
Den Boef

(10) Patent No.: US 9,110,385 B2
(45) Date of Patent: Aug. 18, 2015

(54) METROLOGY METHOD AND APPARATUS, LITHOGRAPHIC APPARATUS, AND DEVICE MANUFACTURING METHOD

(75) Inventor: Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 723 days.

(21) Appl. No.: 12/867,415

(22) PCT Filed: Feb. 23, 2009

(86) PCT No.: PCT/EP2009/001271
§ 371 (c)(1),
(2), (4) Date: Dec. 8, 2010

(87) PCT Pub. No.: WO2009/106279
PCT Pub. Date: Sep. 3, 2009

(65) Prior Publication Data
US 2011/0069292 A1    Mar. 24, 2011

Related U.S. Application Data

(60) Provisional application No. 61/064,358, filed on Feb. 29, 2008.

(51) Int. Cl.
*G03B 27/68* (2006.01)
*G03F 7/20* (2006.01)

(52) U.S. Cl.
CPC ........ *G03F 7/70633* (2013.01); *G03F 7/70625* (2013.01)

(58) Field of Classification Search
CPC .......................... G03F 7/70625; G03F 7/70633
USPC .............................. 355/67, 52; 356/300, 303
See application file for complete search history.

(56) References Cited

U.S. PATENT DOCUMENTS

| | | | |
|---|---|---|---|
| 5,049,740 A * | 9/1991 | Pines et al. ..................... 250/235 |
| 6,614,828 B1 * | 9/2003 | Basting et al. ................ 372/100 |
| 7,046,376 B2 * | 5/2006 | Sezginer ....................... 356/601 |
| 7,061,623 B2 * | 6/2006 | Davidson ...................... 356/497 |
| 7,615,752 B2 | 11/2009 | Raymond et al. |
| 7,969,577 B2 * | 6/2011 | Werkman et al. ............. 356/445 |
| 8,111,398 B2 * | 2/2012 | Van der Schaar et al. .... 356/399 |
| 8,218,146 B2 * | 7/2012 | Rogers et al. ................. 356/432 |
| 2004/0114132 A1 * | 6/2004 | Den Boef et al. ............. 356/124 |
| 2004/0246481 A1 * | 12/2004 | Sandusky ...................... 356/369 |

(Continued)

FOREIGN PATENT DOCUMENTS

WO    WO 2006/091781 A1    8/2006

OTHER PUBLICATIONS

International Search Report mailed May 28, 2009 for International Application No. PCT/EP2009/001271, 4 pgs.

(Continued)

*Primary Examiner* — Deoram Persaud
(74) *Attorney, Agent, or Firm* — Sterne, Kessler, Goldstein & Fox P.L.L.C

(57) ABSTRACT

A metrology apparatus includes first (21) and second (22) radiation sources which generate first (iB1) and second (iB2) illumination beams of different spatial extent and/or angular range. One of the illumination beams is selected, e.g. according to the size of target to be measured. The beam selection can be made by a tillable mirror (254) at a back-projected substrate plane in a Kohler illumination setup.

18 Claims, 5 Drawing Sheets

(56) References Cited

U.S. PATENT DOCUMENTS

| | | |
|---|---|---|
| 2006/0073686 A1* | 4/2006 | Zach et al. .................... 438/551 |
| 2006/0126074 A1* | 6/2006 | Van Der Werf et al. ...... 356/489 |
| 2007/0002336 A1* | 1/2007 | Pellemans et al. ............ 356/625 |
| 2008/0024766 A1 | 1/2008 | Mieher et al. |
| 2008/0037134 A1 | 2/2008 | Den Boef et al. |
| 2008/0186482 A1* | 8/2008 | Den Boef et al. .......... 356/237.2 |
| 2008/0198380 A1* | 8/2008 | Straaijer et al. ............... 356/369 |
| 2008/0239265 A1* | 10/2008 | Den Boef ........................ 355/53 |
| 2008/0279442 A1* | 11/2008 | Den Boef et al. ............. 382/144 |
| 2009/0015821 A1* | 1/2009 | Bevis ............................... 356/73 |
| 2009/0091726 A1* | 4/2009 | Kalf et al. ....................... 355/60 |

OTHER PUBLICATIONS

Written Opinion mailed May 28, 2009 for International Application No. PCT/EP2009/001271, 4 pgs.

\* cited by examiner

METROLOGY METHOD AND APPARATUS, LITHOGRAPHIC APPARATUS, AND DEVICE MANUFACTURING METHOD

This application is a U.S. National Phase of PCT/EP2009/001271, Internationally filed Feb. 23, 2009, which claims the benefit of U.S. provisional application 61/064,358, which was filed on Feb. 29, 2008, and which are both incorporated herein in their entireties by reference.

FIELD

The present invention relates to methods and apparatus for metrology usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithographic processes, it is desirable frequently to make measurements of the structures created, e.g. for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g. intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g. reconstruction of the target structure by iterative approaches such as rigorous coupled wave analysis or finite element methods; library searches; and principal component analysis.

In currently available scatterometers, the target is a relatively large, e.g. 40 µm by 40 µm, grating and the measurement beam generates a spot that is smaller than the grating (i.e. the grating is underfilled). This simplifies reconstruction of the target as it can be regarded as infinite. However, it would be desirable to reduce the size of the target, e.g. to 10 µm by 10 µm or even 5 µm by 5 µm, in order that it could be positioned in amongst product features, rather than in the scribe lane. Placing the target in amongst the product features increases accuracy of measurement because the smaller target is affected by process variations in a more similar way to the product features and because less interpolation may be needed to determine the effect of a process variation at the actual feature site.

However, in order to reduce the target size, it is desirable to reduce a corresponding size of the measurement spot, which is limited by diffraction effects and the positioning accuracy of the stage carrying the substrate being measured and therefore it is desirable to substantially modify and/or redesign an existing metrology device.

SUMMARY

It is desirable to provide an improved metrology device, e.g. that can make measurement on a smaller target.

According to an aspect of the invention, there is provided a metrology apparatus configured to measure a property of a target on a substrate, the apparatus including a first source configured to emit a first illumination beam of radiation; a second source configured to emit a second illumination beam of radiation; a beam selection device configured to select one of the first and second illumination beams as a measurement beam of radiation; an objective lens configured to direct the measurement beam onto the target on the substrate and to collect radiation diffracted by the target; a sensor configured to detect an angle resolved spectrum in a pupil plane of the objective lens.

According to an aspect of the invention, there is provided a lithographic apparatus including: an illumination optical system arranged to illuminate a pattern; a projection optical system arranged to project an image of the pattern on to a substrate; and a metrology device configured to measure a property of a target on the substrate, the device including a first source configured to emit a first illumination beam of radiation; a second source configured to emit a second illumination beam of radiation; a beam selection device configured to select one of the first and second illumination beams as a measurement beam of radiation; an objective lens configured to direct the measurement beam onto the target on the substrate and to collect radiation diffracted by the target; a sensor configured to detect an angle resolved spectrum in a pupil plane of the objective lens.

According to an aspect of the invention, there is provided a method of measuring a property of a target on a substrate, the method including: generating at least one of a first or a second illumination beam, the first and second illumination beams differing in at least one of spatial extent and range of angles; selecting one of the first and second illumination beams as a measurement beam and directing the measurement beam onto the target; collecting radiation diffracted from the marker using an objective lens; detecting an angle-resolved spectrum in a pupil plane of the objective lens.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
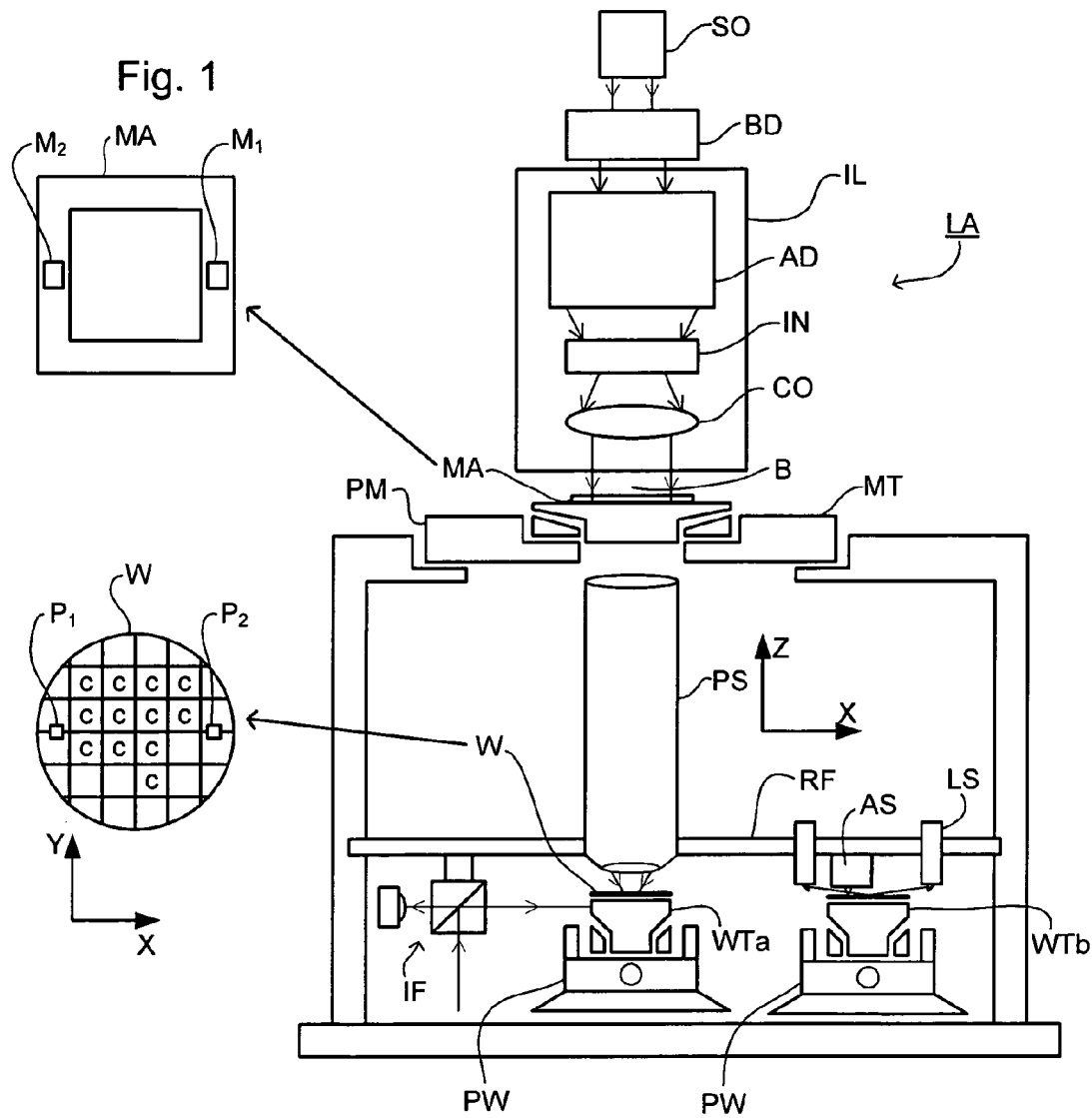
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g. UV radiation or DUV radiation), a patterning device support or support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table MT), and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed.

Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate or one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
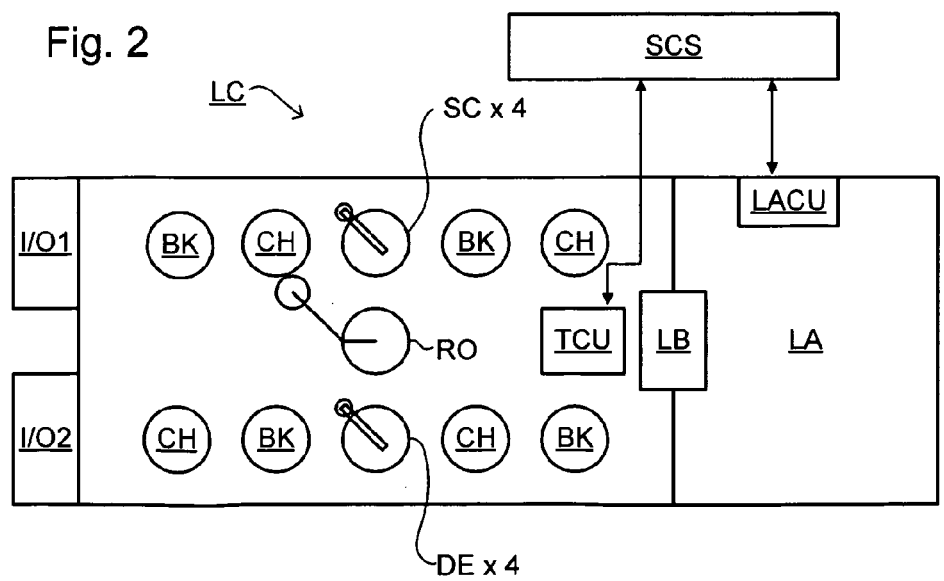
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figure 3:
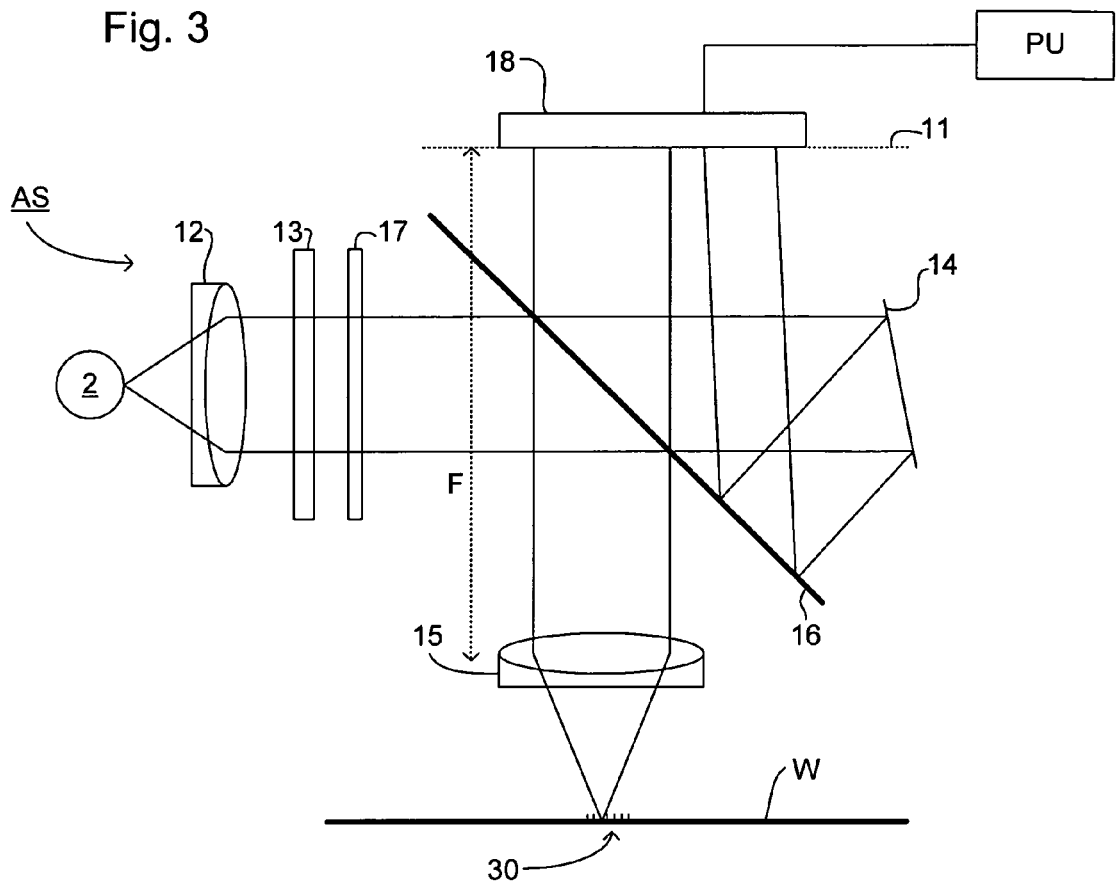
FIG. 3 depicts an angle-resolved scatterometer according to an embodiment of the invention.

The angle-resolved scatterometer, is shown in FIG. 3. In this sensor, the radiation emitted by radiation source unit 2 (described further below) is focused using lens system 12 through filter 13 and polarizer 17, reflected by partially reflective surface 16 and is focused onto substrate W via a microscope objective lens 15, which has a high numerical aperture (NA), preferably at least 0.9 and more preferably at least 0.95. Immersion sensors may even have lenses with numerical apertures over 1. Lens system 12 is arranged to provide a desired illumination mode, e.g. annular or conventional, and preferably so that the parameters of that mode, e.g. $\sigma_{inner}$, $\sigma_{outer}$ or $\sigma$, are adjustable. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is a plane in which the radial position of radiation defines the angle of incidence on the substrate and the angular position defines azimuth angle of the radiation. The detector is preferably a two-dimensional detector so that a two-dimensional angular scatter spectrum of the substrate target can be measured. The detector 18 may be, for example, an array of CCD or CMOS sensors.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

The target on substrate W may be a marker in the form of a grating. Usually, in scatterometry, the scatterometry data of the target is used to reconstruct it, e.g. using iterative techniques in combination with methods to calculate the scattering of light from periodic structures such as Rigorous Coupled Wave Analysis and Finite Element Methods. Alternatively, the iterative methods can be (partly) replaced by a library search of spectra obtained by simulation. However, it is also possible to use techniques such as Principal Component Analysis to obtain information of the property of interest directly from the measured spectra.

Figure 5:
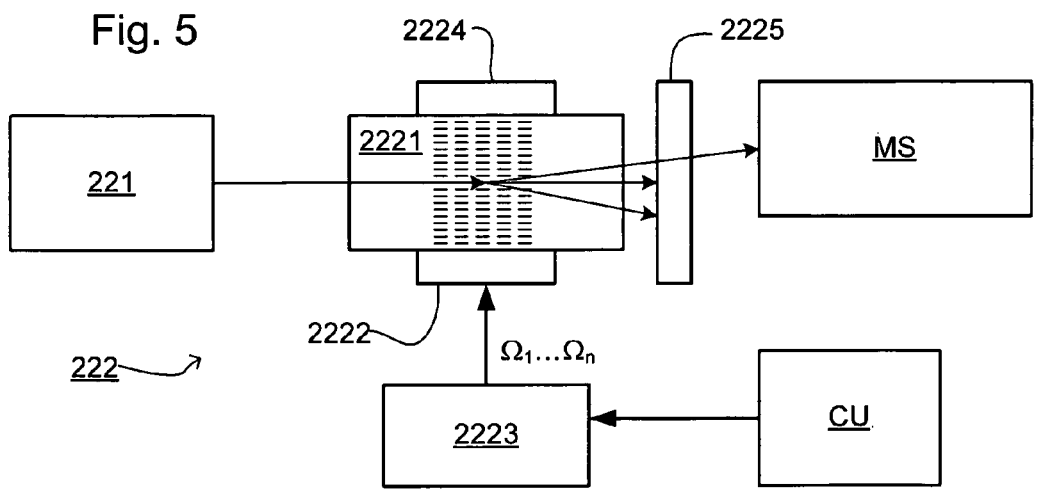
FIG. 5 depicts one of the radiation sources of FIG. 4.
Figure 4:
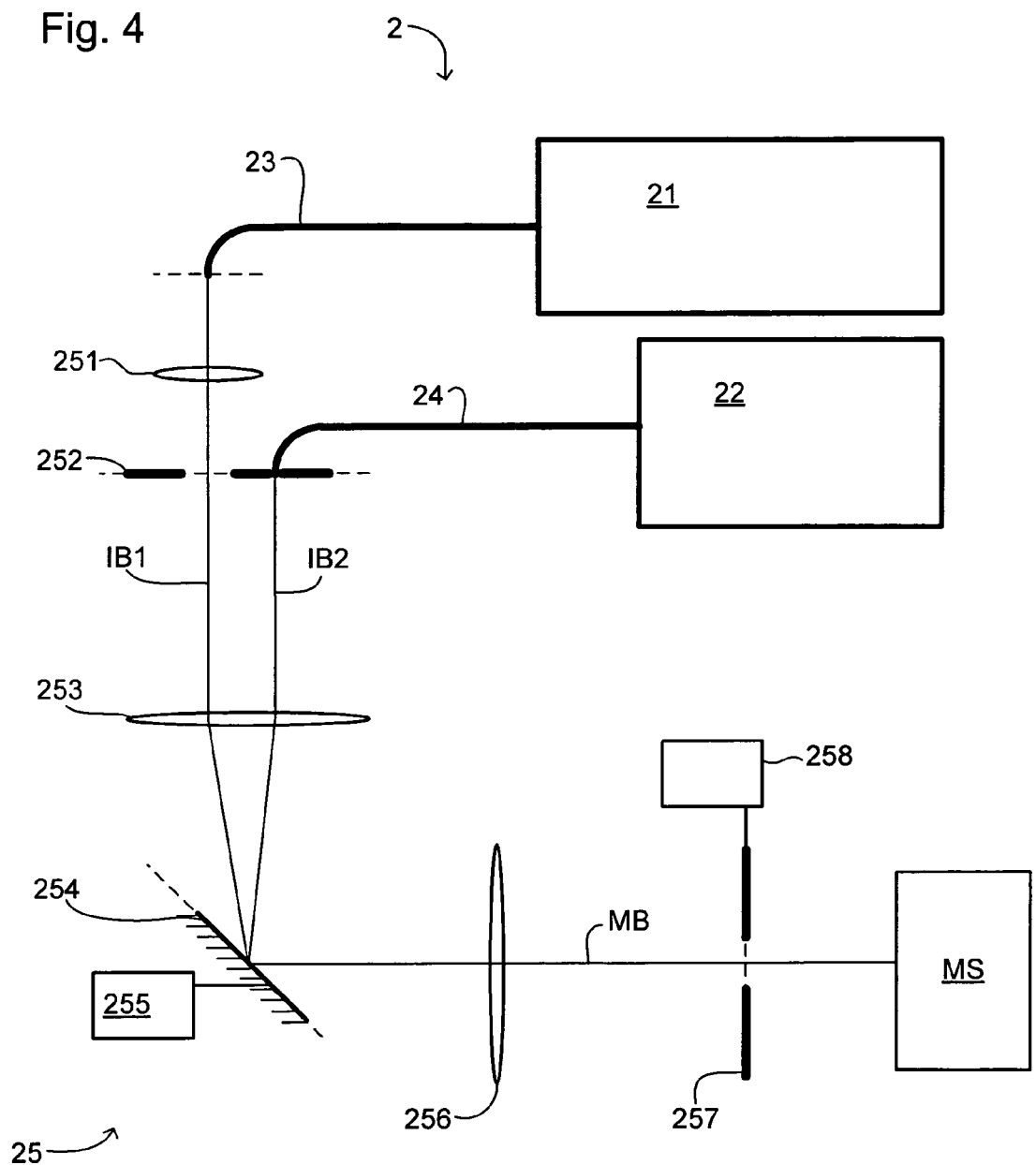
FIG. 4 depicts the radiation sources and beam selection arrangements of the angle resolved scatterometer of FIG. 3.

The radiation source unit 2 is shown in more detail in FIG. 4. The source includes a first source module 21, which may include for example a xenon lamp and provides a first illumination beam IB1, and a second source module 22, which provides a second illumination beam IB2. The second source module may include a supercontinuum laser 221 as shown in FIG. 5, which directs light into an acousto-optical tunable filter (AOTF) 222 which is used to select a narrow range of wavelengths from the broadband (white light) output of the supercontinuum laser 221 to form the second illumination beam. A beam selection unit 25 in the remainder of the metrology device, depicted MS in FIG. 4. Other wavelength selection devices, such as interference filters and dispersive elements (e.g. gratings and prisms), may be used in place of the acousto-optical tunable filter.

The acousto-optical tunable filter 222 is shown in more detail in FIG. 5 and includes an acousto-optical crystal 2221 to which are connected a piezoelectric transducer 2222, driven by a high-frequency driver circuit 2223, and an acoustic absorber 2224. Transducer 2222 creates acoustic waves in the crystal 2221 with a wavelength determined by the mechanical properties (speed of sound) of the crystal and driving frequencies. As these waves propagate through the crystal they form a periodic redistribution of the refractive index of the crystal due to the alternating expansion and contraction of the crystal lattice. This forms a diffraction grating which diffracts the light passing through it, although diffraction occurs throughout the region of interaction rather than at a single point and only radiation meeting phase and/or momentum matching conditions is diffracted. The net effect is that radiation of a narrow band of wavelengths is diffracted away from the main beam and can be selected by a spatial and/or polarizing filter 2225. The center wavelength of the diffracted beam is dependent on the driving frequency of the transducer so it can be controlled within quite a wide range and very rapidly, dependent on the response time of the driver circuit 2223, the transducer 2222 and the crystal 2221. The intensity of the diffracted beam is also controlled by the intensity of the acoustic waves.

Suitable materials which can be used for the acousto-optical crystal include: Quartz ($SiO_2$), KDP ($KH_2PO_4$), Paratellurite or tellurium dioxide ($TeO_2$), $LiNbO_3$, calomel or mercuric chloride ($Hg_2Cl_2$), TAS ($Ta_3AsSe_3$) and Te (tellurium), magnesium fluoride (MgF), and sapphire (aluminum oxide, $Al_2O_3$). The crystal selected determines the detailed geometry of the acousto-optical tunable filter. If a birefringent crystal is used, the filter may also select a particular polarization state.

High frequency drive unit 2223 is connected to the control unit CU of the scatterometer which provides a drive signal to cause the transducer to emit acoustic waves of an appropriate frequency to select a narrow band of wavelengths centered on a desired wavelength, as required for a given measurement. The bandwidth of the transmitted beam is preferably less that 20 nm, less than 15 nm, less than 10 nm or less than 5 nm. The exact relationship between frequency of drive signal and selected wavelength depends on the particular crystal employed and the geometry of the device. In some cases, by applying a drive signal having two or more components of different frequencies $\Omega_1$ to $\Omega_n$, the filter can be operated to select a plurality of components each centered around a different wavelength, which forms a polychromatic beam that allows a plurality of measurements to be made simultaneously. The intensities of the different frequency components of the drive signal can be varied to individually control the intensities of the different wavelengths in the polychromatic beam.

Figure 6:
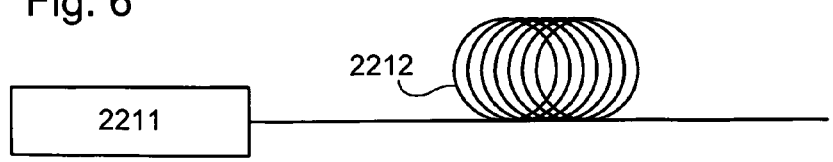
FIG. 6 depicts a supercontinuum laser.

The supercontinuum laser 221 is illustrated in FIG. 6. It includes a pulsed laser source 2211 whose output is fed into a non-linear medium 2212, e.g. a photonic crystal fiber. The pulsed source 2211 emits very short pulses, e.g. of femtosecond or picosecond duration, of a narrow band of wavelengths which are spread by the non-linear medium 2212 into a broadband beam of radiation. This type of source can provide a powerful beam with a low etendue and a suitable range of wavelengths.

Outputs of the first and second sources 21, 22 are conveniently led to the beam selection unit 25 by optical fibers 23 and 24. Fiber 23 may include a multimode fiber and fiber 25 may include an endlessly single-mode PM fiber.

The beam selection unit in this embodiment includes a tilting mirror 254 driven by actuator 255 to select one of the illumination beams IB1, IB2 as the measurement beam MB. The tilting mirror is positioned in a back-projected substrate plane, that is a plane conjugate with the substrate having the target being measured, created by an optical system including a first condensing lens 256. A second condensing lens 253 creates a back-projected pupil plane, that is a plane that is a Fourier transform of the back-projected substrate plane, in which is positioned an aperture plate 252. The aperture plate 252 has two apertures separated by a small distance. In one aperture, a secondary source is formed by a third condensing lens 251 which collects light from the first source 21 output by fiber 23. In the other aperture, the output of the fiber 24, carrying light from second source 22, is located.

With the above arrangement, the two illumination beams are brought together on the tilting mirror 254, but have different angle of incidence. Thus, by changing the angle of the tilting mirror 254 by only a small amount, e.g. less than 50 mrad in an embodiment, one of the illumination beams can be selected and directed along the axis of first condensing lens 256. The other beam is directed off-axis and blocked by an aperture stop 257 provided on a further back-projected pupil plane. Aperture stop 257 is preferably provided in a turret or carousel driven by actuator 258 so that a selected one of a plurality of apertures can be interposed into the optical path, in accordance with the illumination beam chosen.

It will appreciated that the above embodiment can readily be extended to encompass more than two light sources to provide additional flexibility. For example, multiple monochromatic light sources may be used instead of a super-continuum laser and AOTF to provide a choice of wavelength.

The spacing of the multiple sources in the aperture plate 252, the focal lengths of condenser lenses 256 and 253 and the range of movement of the tiltable mirror can be chosen to accommodate the desired number of sources.

Furthermore, as well as switching between illumination beams IB1, IB2, the tiltable mirror can be used, in combination with an appropriate aperture stop 257, to control the angle of illumination at the wafer. The tiltable mirror may be tiltable about one or two axes. Preferably, to avoid positioning errors, the tiltable mirror pivots about the point of incidence of the illumination beams IB1, IB2.

The basic illumination arrangement of the metrology device is Kohler illumination so that the source size and angular distribution in the back-projected pupil plane at aperture plate 252 respectively determine the angular distribution of illumination and spot size on the substrate. Thus, the illustrated arrangement allows for rapid switching between illumination of a small area from a wide range of angles, using the first source module, and illumination of a larger area from a narrow range of angles, using the second source module. By use of a sufficiently powerful source and a rapidly tiltable mirror, a large number of measurements using different angles of illumination can be taken in a short period of time. Alternatively, by integrating measurements taken while tilting the mirror by small amounts about one or two axes, or by using an integrating sensor, a measurement based on a larger illuminated area and a wide range of illumination angles can be obtained. With an embodiment of the invention, a small measurement spot may be provided to underfill relatively large targets, e.g. in the scribe line, for accurate measurements whilst a larger spot with a well defined illumination angle may be provided for measurements of relatively small targets, e.g. in-die markers.

The two sources may both be kept on during use of the apparatus to allow rapid selection between them or selectively energized as required.

Figure 7:
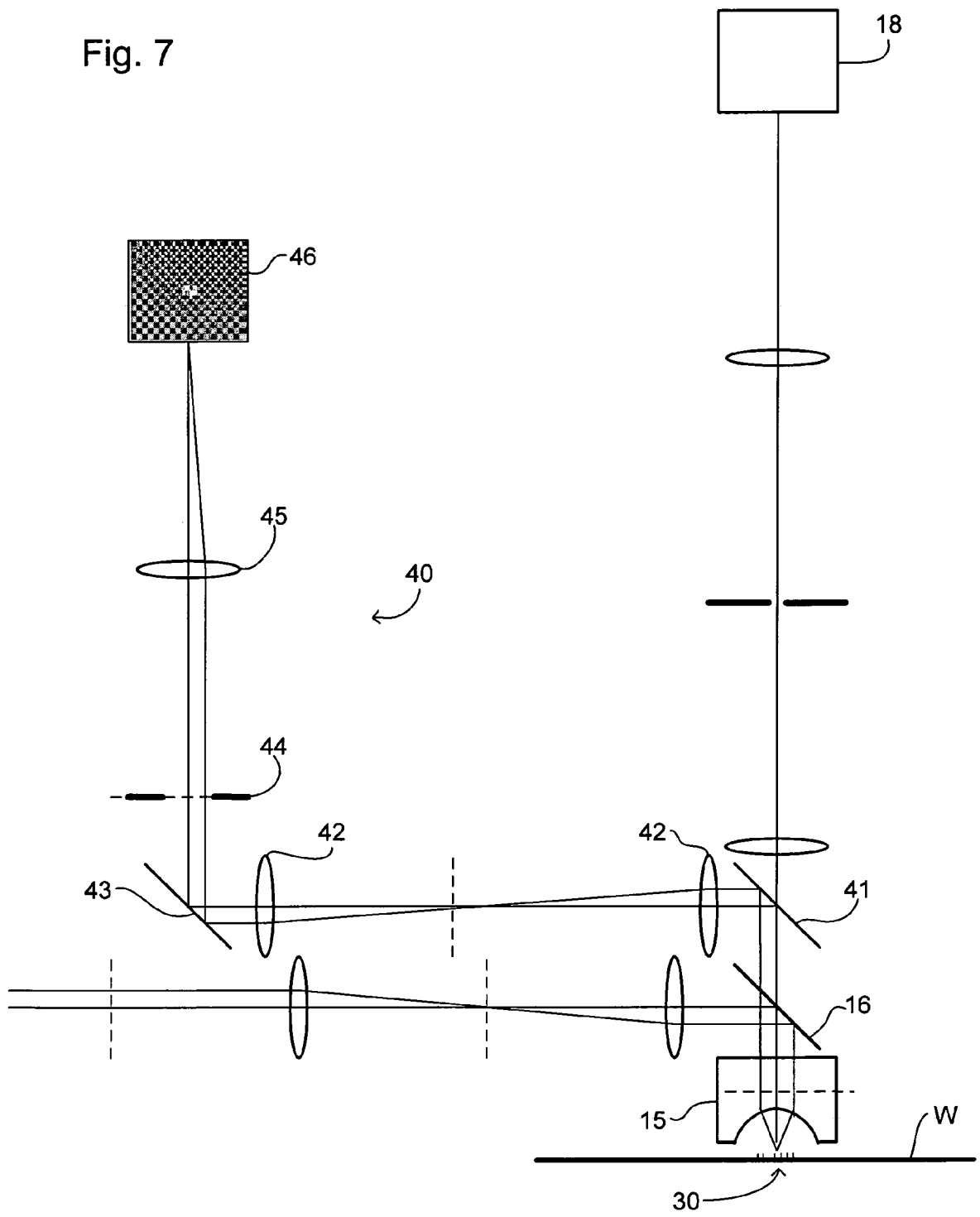
FIG. 7 depicts the measurement branches of an embodiment of the invention.

In an embodiment of the invention, the measurement branch of the metrology device can be supplemented by an additional, high-speed sensor, as shown in FIG. 7. The additional measurement branch 40 includes: a partly-silvered mirror or beam splitter 41 to direct some light reflected from the target and collected by objective 15 into the measurement branch; imaging optics 42 to project an image of the pupil plane of the objective 15 onto an adjustable aperture stop 44; and a further lens or lens system 45 to form an image of the target on second sensor 46, which may be a CMOS camera. In some particular embodiments a high-speed camera is desirable. A folding mirror 43 is provided for convenience. The adjustable aperture stop 44 can allow selective blocking of the zeroth order, e.g. for overlay measurements, but pass it, e.g., for CD measurements.

The above apparatus can be used to measure overlay as follows. Two images of the overlay target, e.g. a biased grating, are obtained using respective different angles of illumination. In an embodiment, the illumination of the target for the two images is inclined to the normal by the same angle but in opposite directions. Using a pattern recognition algorithm, the area of the grating can be identified in each image and an intensity value obtained from the identified area. The overlay can then be determined from the difference in intensity values. This method can be extended to measure overlay in two directions by taking two further images with the illumination angle rotated azimuthally by about 90 degrees.

Figure 8:
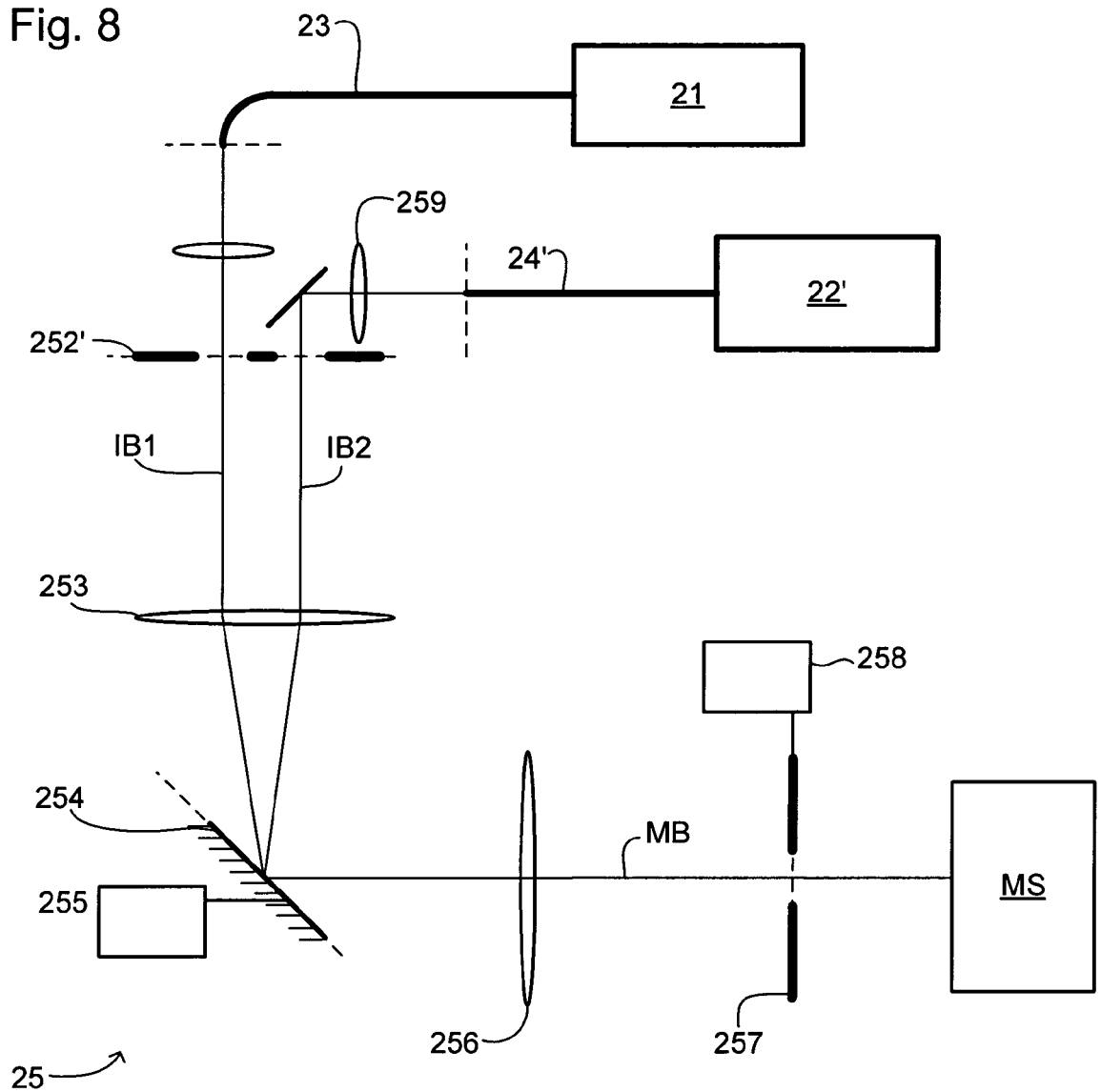
FIG. 8 depicts the radiation sources and beam selection arrangements of an embodiment of the invention.

Another embodiment of the invention differs from the embodiment of the invention described above in the source modules but is otherwise the same. It is shown in FIG. 8. Rather than a supercontinuum laser, the second source module 22' includes a xenon lamp and fiber 24' is a multimode fiber similar to fiber 23. An additional condensing lens 259 is also included between the end of fiber 24' and the aperture plate 252'. The folding mirror illustrated is merely for convenience and can be omitted if desired. Aperture plate 252' has aperture sizes appropriate to the beams generated by the two source modules.

Thus, in the embodiment of FIG. 8, the second source module 22 is equivalent in structure and set up to the first source module 21, but differs in that the fiber 24' has a different diameter than fiber 23. For example, fiber 23 may have a diameter of about 100 μm and fiber 24' a diameter of about 400 μm. Since the ends of fibers 21 and 24' are imaged on the tiltable mirror 254, the tiltable mirror can be used to simply and quickly select between sources and hence the size of the spot illuminated on the substrate W. As in the embodiment of FIG. 4 more than two sources can be used to enable a wider choice of spot sizes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention May be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A metrology apparatus configured to measure a property of a target on a substrate, the apparatus comprising:
    a first source configured to emit a first illumination beam of radiation;
    a second source configured to emit a second illumination beam of radiation wherein the first illumination beam of radiation differs from the second illumination beam of radiation in at least one of spot size and angular distribution;
    an aperture plate having first and second openings configured to pass the first and second illumination beams, respectively;
    a beam selection device comprising a tiltable mirror tiltable about two axes, wherein the tiltable minor is positioned such that the first illumination beam of radiation is incident on the tiltable mirror at a first angle of incidence and the second illumination beam is incident on the tiltable mirror at a second angle of incidence and wherein the beam selection device is configured to select one of the first and second illumination beams of radiation as a measurement beam of radiation by tilting the tiltable mirror, wherein the tiltable mirror is positioned in a conjugate plane of the substrate and the aperture plate is positioned in a plane that is a Fourier transform of the conjugate plane of the substrate;
    an objective lens configured to direct the measurement beam of radiation onto the target on the substrate and to collect radiation diffracted by the target; and
    a sensor configured to detect an angle resolved spectrum in a pupil plane of the objective lens.

2. The apparatus according to claim 1, wherein the first source comprises:
    a broadband radiation source configured to emit a third illumination beam of radiation having a first wavelength range; and
    a wavelength selection device configured to output the first illumination beam of radiation by selecting a second wavelength range from the third illumination beam of radiation.

3. The apparatus according to claim 2, wherein the wavelength selection device comprises at least one of an acousto-optical tunable filter, a dispersive element, or an interference filter.

4. The apparatus according to claim 2, wherein the broadband radiation source comprises a supercontinuum laser.

5. The apparatus according to claim 1, wherein at least one of the first and second sources comprises a xenon lamp.

6. The apparatus according to claim 1, wherein the first source comprises a xenon lamp and the second source comprises:
    a broadband radiation source configured to emit a third illumination beam of radiation having a first wavelength range; and
    a wavelength selection device configured to generate the second illumination beam of radiation by selecting a second wavelength range from the third illumination beam of radiation.

7. The apparatus according to claim 6, wherein the wavelength selection device comprises at least one of an acousto-optical tunable filter, a dispersive element or an interference filter.

8. The apparatus according to claim 6, wherein the broadband radiation source comprises a supercontinuum laser.

9. The apparatus according to claim 1, wherein each of the first and second sources comprises a xenon lamp.

10. The apparatus according to claim 1, wherein:
    the objective lens has a pupil plane;
    the first and second sources are configured so that the first and second illumination beams have respective spatial extents and angular ranges at a plane conjugate with the pupil plane of the objective lens; and
    at least one of the spatial extent and angular range of the first illumination beam being different from the spatial extent and angular range of the second illumination beam.

11. The apparatus according to claim 1, wherein the beam selection device further comprises an optical system configured to direct the first and second illumination beams onto a pivot point of the tiltable mirror and wherein the optical system comprises the aperture plate.

12. The apparatus according to claim 1, wherein the tiltable mirror is configured so that changes in its orientation change the angle of incidence of the measurement beam of radiation on the substrate.

13. The apparatus according to claim 1, wherein the beam selection device further comprises a selectable aperture stop.

14. The apparatus according claim 1, further comprising:
    an additional sensor;
    a beam splitter configured to direct a part of the radiation collected by the objective lens to the additional sensor; and
    an imaging optical system configured to form an image of the target on the additional sensor.

15. A lithographic apparatus comprising:
    an illumination optical system arranged to illuminate a pattern;
    a projection optical system arranged to project an image of the pattern onto a substrate; and
    a metrology device configured to measure a property of a target on the substrate, the metrology device comprising:
        a first source configured to emit a first illumination beam of radiation;
        a second source configured to emit a second illumination beam of radiation, wherein the first illumination beam of radiation differs from the second illumination beam of radiation in at least one of spot size and angular distribution;
        an aperture plate having first and second openings configured to pass the first and second illumination beams, respectively;
        a beam selection device comprising a tiltable mirror tiltable about two axes, wherein the tiltable mirror is positioned such that the first illumination beam of radiation is incident on the tiltable mirror at a first angle of incidence and the second illumination beam is incident on the tiltable mirror at a second angle of incidence and wherein the beam selection device is configured to select one of the first and second illumination beams of radiation as a measurement beam of radiation by tilting the tiltable mirror, wherein the tiltable mirror is positioned in a conjugate plane of the substrate and the aperture plate is positioned in a plane that is a Fourier transform of the conjugate plane of the substrate;

an objective lens configured to direct the measurement beam of radiation onto the target on the substrate and to collect radiation diffracted by the target; and a sensor configured to detect an angle resolved spectrum in a pupil plane of the objective lens.

16. The apparatus according to claim 15, further comprising:

an exposure station; and a measurement station, wherein the substrate table is moveable between the exposure station and the measurement station, and wherein the metrology device is positioned at the measurement station.

17. A method of measuring a property of a target on a substrate, the method comprising:

generating first and second illumination beams, the first and second illumination beams differing in at least one of spatial extent and range of angles, the first and second beams being incident on a mirror tiltable about two axes, wherein the first illumination beam of radiation is incident on the mirror at a first angle of incidence and the second illumination beam is incident on the mirror at a second angle of incidence, wherein the first illumination beam of radiation differs from the second illumination beam of radiation in at least one of spot size and angular distribution;

passing the first and second illumination beams through first and second apertures of an aperture plate;

tilting the mirror such that one of the first and second illumination beams is directed onto the target, wherein the mirror is positioned in a conjugate plane of the substrate and wherein the aperture plate is positioned in a plane that is a Fourier transform of the conjugate plane of the substrate;

collecting radiation diffracted from the target using an objective lens; and detecting an angle-resolved spectrum in a pupil plane of the objective lens.

18. The method according to claim 17, wherein the tilting is based on a size, or type, or both the size and type of the target.

* * * * *

UNITED STATES PATENT AND TRADEMARK OFFICE
CERTIFICATE OF CORRECTION

PATENT NO. : 9,110,385 B2  
APPLICATION NO. : 12/867415  
DATED : August 18, 2015  
INVENTOR(S) : Arie Jeffrey Den Boef Page 1 of 1

It is certified that error appears in the above-identified patent and that said Letters Patent is hereby corrected as shown below:

Title Page, Item (57), Abstract section, on line 6 of the abstract, after "can be made by a", please delete "tillable" and insert --tiltable--.

In the Claims:

In column 11, line 24, after "tiltable" please delete "minor" and insert --mirror--.

Signed and Sealed this  
Fifth Day of April, 2016

Michelle K. Lee  
*Director of the United States Patent and Trademark Office*